(12) United States Patent
Vobecky et al.

(10) Patent No.: US 11,056,582 B2
(45) Date of Patent: Jul. 6, 2021

(54) BIDIRECTIONAL PHASE CONTROLLED THYRISTOR (BIPCT)—A NEW SEMICONDUCTOR DEVICE CONCEPT

(71) Applicant: ABB Power Grids Switzerland AG, Baden (CH)

(72) Inventors: Jan Vobecky, Lenzburg (CH); Umamaheswara Vemulapati, Windisch (CH); Munaf Rahimo, Gänsbrunnen (CH)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 16/969,773

(22) PCT Filed: Feb. 13, 2019

(86) PCT No.: PCT/EP2019/053560
§ 371 (c)(1),
(2) Date: Aug. 13, 2020

(87) PCT Pub. No.: WO2019/158594
PCT Pub. Date: Aug. 22, 2019

(65) Prior Publication Data
US 2020/0411674 A1 Dec. 31, 2020

(30) Foreign Application Priority Data

Feb. 13, 2018 (EP) .................................. 18156415

(51) Int. Cl.
*H01L 29/747* (2006.01)
*H01L 29/06* (2006.01)
(Continued)

(52) U.S. Cl.
CPC ........ *H01L 29/747* (2013.01); *H01L 29/0692* (2013.01); *H01L 29/0839* (2013.01); *H01L 29/42308* (2013.01)

(58) Field of Classification Search
CPC .............. H01L 29/747; H01L 29/0692; H01L 29/0839; H01L 29/42308; H01L 29/7404;
(Continued)

(56) References Cited

U.S. PATENT DOCUMENTS 3,476,993 A * 11/1969 Aldrich ................... H01L 29/87
257/128
4,223,332 A  9/1980 Sittig
(Continued)

FOREIGN PATENT DOCUMENTS

EP  0002840 A1  7/1979
EP  0880182 A2  11/1998
(Continued)

*Primary Examiner* — Stephen M Bradley
*Assistant Examiner* — Wasiul Haider
(74) *Attorney, Agent, or Firm* — Slater Matsil, LLP

(57) ABSTRACT

A bidirectional thyristor device includes a semiconductor wafer with a number of layers forming pn junctions. A first main electrode and a first gate electrode are arranged on a first main side of the wafer. A second main electrode and a second gate electrode are arranged on a second main side of the wafer. First emitter shorts penetrate through a first semiconductor layer and second emitter shorts penetrate through a fifth semiconductor layer. In an orthogonal projection onto a plane parallel to the first main side, a first area occupied by the first semiconductor layer and the first emitter shorts overlaps in an overlapping area with a second area occupied by the fifth semiconductor layer and the second emitter shorts. The overlapping area, in which the (Continued)

first area overlaps with the second area, encompasses at least 50% of a total wafer area occupied by the semiconductor wafer.

20 Claims, 6 Drawing Sheets

(51) Int. Cl.
*H01L 29/08* (2006.01)
*H01L 29/423* (2006.01)

(58) Field of Classification Search
CPC ........... H01L 29/0834; H01L 29/66386; H01L 2924/13033
See application file for complete search history.

(56) References Cited

U.S. PATENT DOCUMENTS

| 6,078,065 | A | 6/2000 | Streit et al. |
| 2004/0183092 | A1 | 9/2004 | Yamaguchi et al. |
| 2013/0105857 | A1* | 5/2013 | Streit ...................... H01L 29/74 257/157 |

FOREIGN PATENT DOCUMENTS

| JP | 2003282865 A | 10/2003 |
| WO | 2011161097 A2 | 12/2011 |

* cited by examiner

BIDIRECTIONAL PHASE CONTROLLED THYRISTOR (BIPCT)—A NEW SEMICONDUCTOR DEVICE CONCEPT

CROSS-REFERENCE TO RELATED APPLICATIONS

This application is a national stage application of International Application No. PCT/EP2018/053560, filed on Feb. 13, 2019, which application claims priority to European Patent Application No. 18156415.4, filed on Feb. 13, 2018, which applications are hereby incorporated herein by reference.

FIELD OF THE INVENTION

The present invention relates to a bidirectional thyristor device implemented in a single semiconductor wafer.

BACKGROUND OF THE INVENTION

A thyristor, sometimes also referred to as silicon controlled rectifier (SCR), is a switching semiconductor device which can be turned on in a forward direction, i.e. when being forward biased, by supplying a positive gate trigger current pulse to a gate terminal. The thyristor is then said to be in a forward conducting state or on-state in which a current can flow in a forward direction from an anode to a cathode. On the other hand, the thyristor can also be in a forward blocking state, also referred to as off-state, meaning that the flow of a high current through anode can be blocked and a thyristor withstands a high positive voltage in the forward direction. In a reverse direction opposite to the forward direction, the thyristor cannot be turned on. A thyristor may be reverse blocking, which means that it can maintain at least approximately the same voltage in the reverse direction without a significant current flow as in the forward blocking state, or asymmetric, which means that it has virtually no blocking capability in the reverse direction. Since phase control applications commonly require reverse blocking capabilities, a phase control thyristor (PCT) (suitable for 50/60 Hz frequencies) is typically reverse blocking.

Known thyristors include emitter shorts to control the spread of a plasma in lateral direction when turning on the thyristor and to reduce the amplification factor of the internal NPN transistor hereby reducing the leakage current and increasing the dV/dt capability during fast rise of forward blocking voltage (i.e. no triggering at zero gate current while an anode forward voltage with a high dV/dt is applied). According to WO 2011/161097 A2 an emitter shorts pattern of a thyristor should be as uniform and homogenous as possible, ideally with a constant density of shorts over the whole cathode region, and all subregions thereof, in particular in cathode regions close to the gate structure to achieve a high lateral plasma spread velocity and a high maximum current change didt.

In many applications such as a matrix converter, a direct current (DC) breaker, and static VAR compensator (SVC) bidirectional power device functionality is required to block voltage and to conduct current in both directions. For bidirectional power semiconductor device functionality, nowadays often two reverse blocking (RB) thyristors are used in antiparallel configuration or two reverse-conducting (RC) thyristors are used in back-to-back configuration. A configuration with two RC thyristors in back-to-back configuration has the disadvantage of high losses as the losses of the two thyristors add up in the serial connection.

From U.S. Pat. No. 3,476,993 A there is known a five-layer switch-type device with two thyristor structures in anti-parallel configuration. However, of the two thyristor structures use different areas of a semiconductor wafer so that the area of the semiconductor wafer is not efficiently used in this known five-layer switch-type device.

From US 2004/0183092 A1 there is known a thyristor structure with three separate lifetime control regions inside a low doped intermediate semiconductor layer of the thyristor structure.

In the bidirectionally controlled thyristor (BCT) disclosed in EP 0 880 182 B1 two anti-parallel thyristors are integrated onto one single wafer and are assembled into one housing. With two thyristor halves integrated in one single package the BCT enables a more compact equipment design, simplifies the cooling system for high power applications, and increases system reliability. However, in the BCT only less than half of the wafer area can be used for each current direction or polarity. A major challenge in the integration of the two thyristor halves in the BCT is to avoid cross talk between the two thyristor halves, which are separated from each other by a separation region in the semiconductor wafer. Another problem in BCT device operation is the thermal management as heat generation is not homogeneously distributed over the whole wafer area.

SUMMARY OF THE INVENTION

In view of the above described disadvantages of the prior art it is the object of the invention to provide a bidirectional thyristor device which makes efficient use of the whole device area for both current directions to provide a smaller device with good electrical and thermal properties.

The object of the invention is attained by a bidirectional thyristor device according to claim 1.

The bidirectional thyristor device has a structure in which the first semiconductor layer may be seen as a cathode of a first thyristor and the fifth semiconductor layer may be seen as a cathode of a second thyristor that is connected in anti-parallel configuration to the first thyristor. The first emitter shorts in combination with the second semiconductor layer can be seen as an anode of the second thyristor, while the second emitter shorts in combination with the fourth semiconductor layer can be seen as an anode of the first thyristor. Accordingly, in the bidirectional thyristor device of the invention the cathodes and anodes of the first and second thyristors are interdigitated in a way that the first emitter shorts of the first thyristor are used for the anode of the second thyristor and the second emitter shorts of the second thyristor are used for the anode of the first thyristor.

In the invention the first and second thyristor are integrated in a single semiconductor wafer in antiparallel configuration between the first and second main electrode. Compared to the known BCT, there is no separation region needed between the two thyristors and due to the overlap between the first area occupied by the first semiconductor layer and the first emitter shorts with the second area occupied by the fifth semiconductor layer and the second emitter shorts in the orthogonal projection onto the plane parallel to the first main side, the bidirectional thyristor device of the invention can make more efficient use of the wafer area for both polarities, respectively.

In the bidirectional thyristor device, when being viewed in the orthogonal projection onto the plane parallel to a first main side of the semiconductor wafer, an overlapping area, in which the first area overlaps with the second area, encompasses at least 50% of a total wafer area occupied by the semiconductor wafer. Accordingly at least 50% of the total wafer area is used for both polarities, respectively.

Further developments of the invention are specified in the dependent claims.

In an exemplary embodiment of the bidirectional thyristor device, when being viewed in the orthogonal projection onto the plane parallel to the first main side, the first emitter shorts occupy at least 2%, exemplarily at least 5%, exemplarily at least 8%, more exemplarily at least 10% of the overlapping area. With a relatively large area occupied by the first emitter shorts, the on-state voltage of the second thyristor at high anode current can be decreased compared to a thyristor device having the same structure but less area occupied by the first emitter shorts.

In an exemplary embodiment of the bidirectional thyristor device, when being viewed in the orthogonal projection onto the plane parallel to the first main side, the second emitter shorts occupy at least 2%, exemplarily at least 5%, exemplarily at least 8%, more exemplarily at least 10% of the overlapping area. With a relatively large area occupied by the second emitter shorts, the on-state voltage of the first thyristor at high anode current can be decreased compared to a thyristor device having the same structure but less area occupied by the first emitter shorts.

In an exemplary embodiment of the bidirectional thyristor device, when being viewed in the orthogonal projection onto the plane parallel to the first main side, the first emitter shorts are discrete. Discrete first emitter shorts allow especially efficient spreading of the plasma in a lateral direction when switching the first thyristor from a forward blocking state (off-state) to a forward conducting state (on-state). Throughout the specification a lateral direction refers to a direction parallel to the first main side. A distance between two neighbouring discrete first emitter shorts may be varied in such way that an average distance between two neighbouring first emitter shorts is decreasing with increasing distance from the first gate electrode, i.e. the density of the first emitter shorts is increasing with increasing lateral distance from the first gate electrode. Such variation of the density of the first emitter shorts allows the second thyristor to have a relatively low on-state voltage at a high anode current while the first thyristor can be triggered at a relatively low anode current (i.e. the first thyristor has a high didt capability). Throughout the specification the average distance between two neighbouring emitter shorts at a certain distance d from the gate electrode means the arithmetic mean of a distance between all pairs of neighbouring first emitter shorts in an area including all positions that have a distance in a range from d to d+Δd, wherein Δd is constant for the calculation of the average distance at all distances d, for example Δd=5 mm.

In an exemplary embodiment of the bidirectional thyristor device, in the orthogonal projection onto the plane parallel to the first main side, the second emitter shorts are discrete. Discrete second emitter shorts allow especially efficient spreading of the plasma in a lateral direction when switching the second thyristor from off-state to on-state. A distance between two neighbouring discrete second emitter shorts may be varied in such way that an average distance between two neighbouring second emitter shorts is decreasing with increasing distance from the second gate electrode, i.e. the density of the second emitter shorts is increasing with increasing lateral distance from the second gate electrode. Such variation of the density of the second emitter shorts allows the first thyristor to have a relatively low on-state voltage at a high anode current while the second thyristor can be triggered at a relatively low anode current (i.e. the second thyristor has a high didt capability).

As explained above a distance between two neighbouring discrete first (second) emitter shorts may be varied in such way that an average distance between two neighbouring first (second) emitter shorts is decreasing with increasing distance from the second gate electrode, i.e. the density of the second emitter shorts is increasing with increasing lateral distance from the second gate electrode. In addition, there may be channels with a lower density of first (second) emitter shorts in an area of high density of shorts to allow for a fast turn-ON (i.e. faster plasma spread) even in the areas remote to the gate through these channels. This feature can be important especially for large area devices.

In an exemplary embodiment, when being viewed in the orthogonal projection onto the plane parallel to the first main side, the first emitter shorts and the second emitter shorts have a lateral size in a range from 30 μm to 500 μm, exemplarily in a range from 50 μm to 200 μm.

In an exemplary embodiment, in the orthogonal projection onto the plane parallel to the first main side, at least the first gate electrode or the second gate electrode has a rotational symmetry. Such shape of the gate electrode with rotational symmetry allows most efficient use of the wafer area of thyristors for ceramic hockey-puck packages and improves thermal management of the device.

In an exemplary embodiment, when being viewed in the orthogonal projection onto the plane parallel to the first main side, the first gate electrode and the second gate electrode have the same shape. Such same shape of the first and second gate electrode allows to simplify the process of manufacturing the device as the same mask designs can be used for structuring the first and second gate electrodes.

In an exemplary embodiment a density of deep levels acting as recombination centers in the third semiconductor layer has a first local maximum which is closer to the second p-n junction than to the third p-n junction and/or a second local maximum which is closer to the third p-n junction than to the second p-n junction. The first local maximum may exemplarily be less than 50 μm from the second p-n junction, and/or the second local maximum may be exemplarily less than 50 μm from the third p-n junction. The local maximum of the density of deep levels acting as recombination centers in the third semiconductor layer close to the second and/or third p-n junction can improve the turn-off capability of the bidirectional thyristor device by commutation of anode voltage.

In an exemplary embodiment, an excess carrier lifetime has a first local minimum which is closer to the second p-n junction than to the third p-n junction and/or a second local minimum at a position which is closer to the third p-n junction than to the second p-n junction. The first local minimum may exemplarily be less than 50 μm from the second p-n junction, and/or the second local minimum may exemplarily be less than 50 μm from the third p-n junction. The local minimum of the excess carrier lifetime in the third semiconductor layer close to the second and/or third p-n junction can improve the turn-off capability of the bidirectional thyristor device by commutation of anode voltage.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF EXEMPLARY EMBODIMENTS

Figure 1:
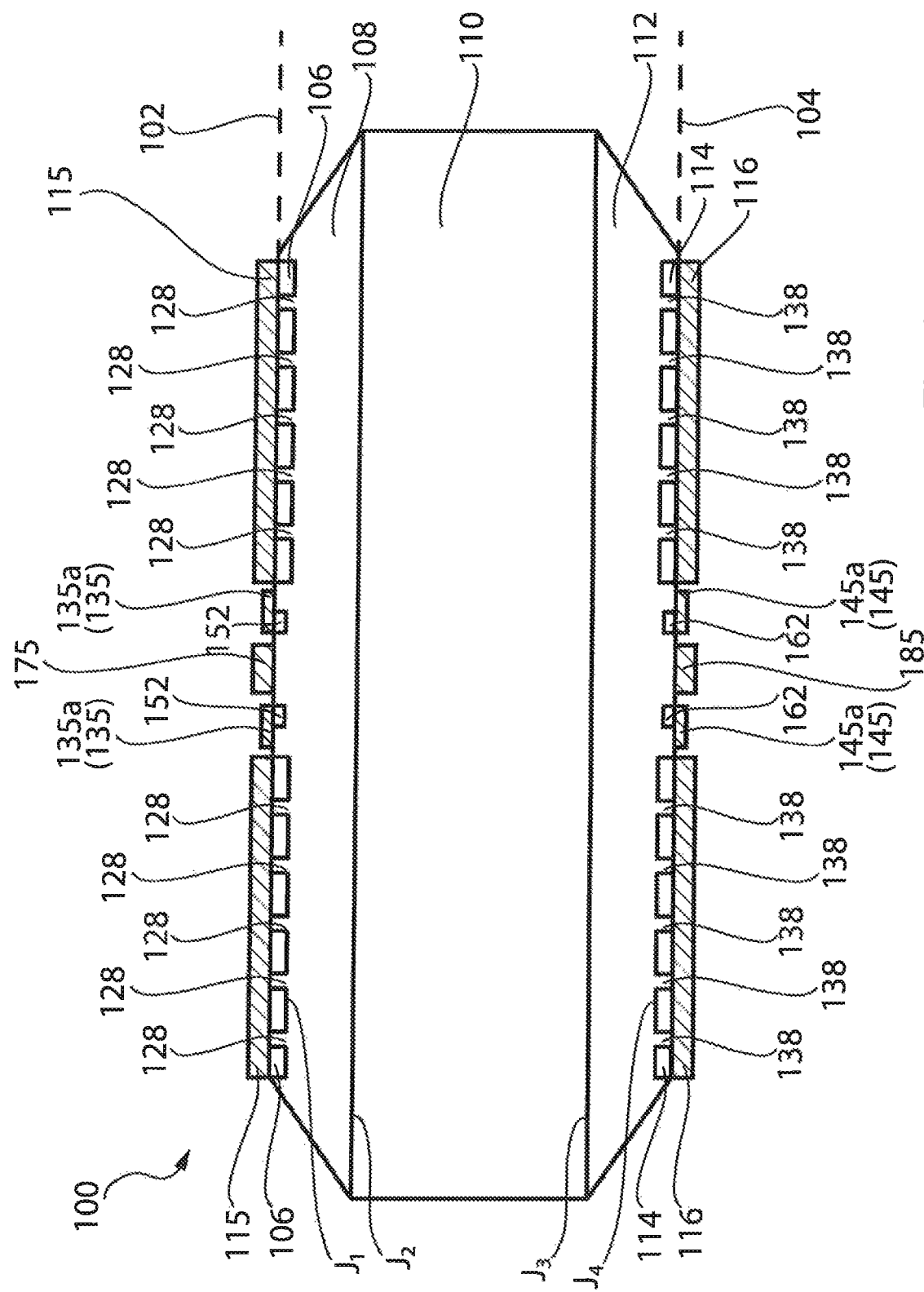
FIG. 1 shows a cross-sectional view of a bidirectional thyristor device according to an embodiment of the invention.
Figure 2:
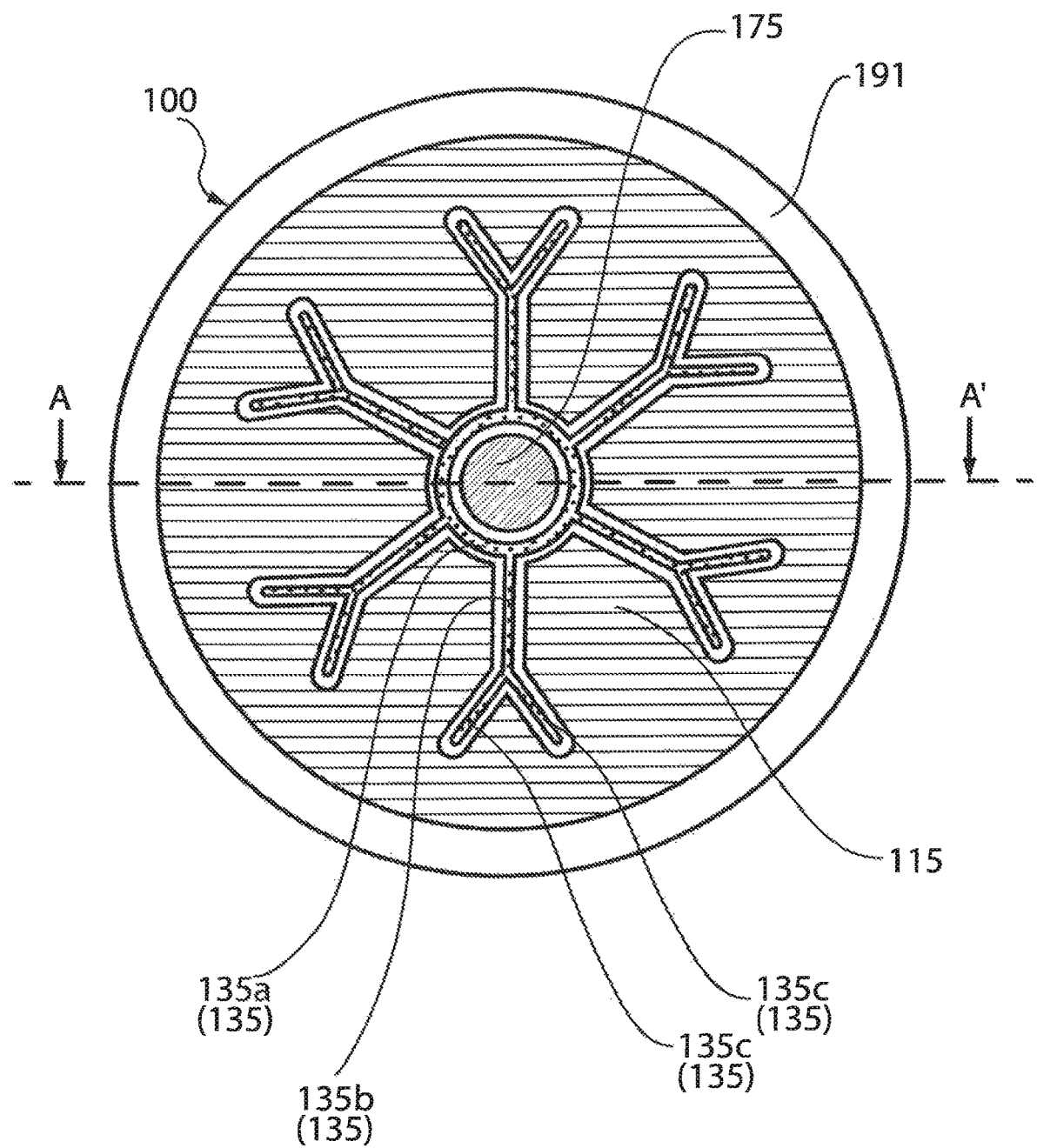
FIG. 2 shows a top view of the bidirectional thyristor device of FIG. 1.
Figure 3:
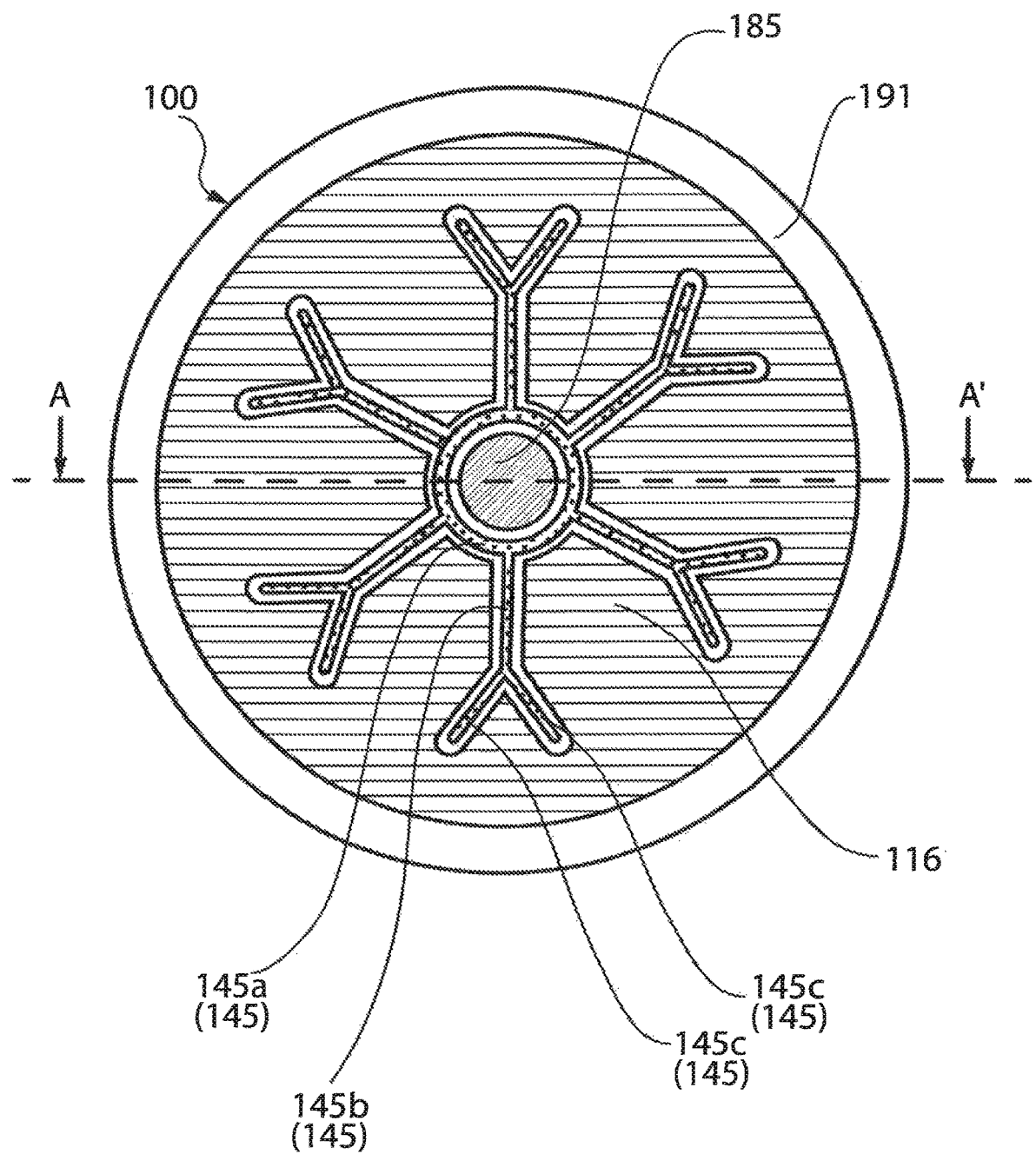
FIG. 3 shows a bottom view of the bidirectional thyristor device of FIG. 1.

FIG. 1 shows a vertical cross-section of a bidirectional thyristor device 100 according to an embodiment of the invention, FIG. 2 shows a top view of the bidirectional thyristor device 100 and FIG. 3 shows a bottom view of the bidirectional thyristor device 100. The bidirectional thyristor device 100 comprises a semiconductor wafer having a first main side 102 and a second main side 104 opposite and parallel to the first main side 102. The plane of the drawing in FIG. 1 is a plane perpendicular to the first main side 102. The cross-section shown in FIG. 1 is taken along a line A-A' in FIGS. 2 and 3, respectively.

In an order from the first main side 102 of the semiconductor wafer, the semiconductor wafer comprises an n$^+$-doped first semiconductor layer 106, a p-doped second semiconductor layer 108, an n$^-$-doped third semiconductor layer 110, a p-doped fourth semiconductor layer 112, and an n$^+$-doped fifth semiconductor layer 114. The n$^+$-doped first semiconductor layer 106 and the p-doped second semiconductor layer 108 form a first p-n junction $J_1$, the p-doped second semiconductor layer 108 and the n$^-$-doped third semiconductor layer 110 form a second p-n junction $J_2$, the n$^-$-doped third semiconductor layer 110 and the p-doped fourth semiconductor layer 112 form a third p-n junction $J_3$, and the p-doped fourth semiconductor layer 112 and the n$^+$-doped fifth semiconductor layer 114 form a fourth p-n junction $J_4$. A plurality of first emitter shorts 128 is provided at the first main side 102, wherein each first emitter short 128 is a p-type semiconductor region penetrating through the first semiconductor layer 106 to electrically connect the p-type second semiconductor layer 108 with the first main electrode 115. The doping level of the first emitter shorts 128 may exemplarily be the same as that of the p-doped second semiconductor layer 108 or may be higher than that of the p-doped second semiconductor layer 108. Likewise, a plurality of second emitter shorts 138 is provided at the second main side 104, wherein each second emitter short 138 is a p-type semiconductor region penetrating through the n$^+$-doped fifth semiconductor layer 114 to electrically connect the p-type fourth semiconductor layer 112 with the second main electrode 116. The doping level of the second emitter shorts 138 may exemplarily be the same as that of the p-doped fourth semiconductor layer 112 or may be higher than that of the p-doped fourth semiconductor layer 112. In the embodiment the first and the second emitter shorts 128, 138 are discrete. For example, the first and the second emitter shorts 128, 138 may be dot-shaped in the orthogonal projection onto the plane parallel to the first main side 102 and may have a lateral size in a range from 30 μm to 500 μm, exemplarily in a range from 50 μm to 200 μm. Therein, the lateral size is defined as the maximal lateral dimension in the orthogonal projection onto the plane parallel to the first main side 102. Alternatively, the first and second emitter shorts 128, 138 may be polygon-shaped.

On the first main side 102 of the semiconductor wafer there is arranged a first main electrode 115 in direct contact with the n$^+$-doped first semiconductor layer 106 to form an ohmic contact to the n$^+$-doped first semiconductor layer 106. Likewise, on the second main side 104 of the semiconductor wafer there is arranged a second main electrode 116 in direct contact with the n$^+$-doped fifth semiconductor layer 114 to form an ohmic contact to the n$^+$-doped fifth semiconductor layer 114. A first amplifying gate electrode 135 (which is an example of the first gate electrode in the claims) is arranged on the first main side 102. The first amplifying gate electrode 135 is electrically separated from the first main electrode 115 and is in direct contact with the p-doped second semiconductor layer 108 to form an ohmic contact with the p-doped second semiconductor layer 108 at a position lateral to the first main electrode 115. As can be seen best from FIG. 2, the first amplifying gate electrode 135 comprises a first ring-shaped electrode portion 135a, which is concentric with a center of the semiconductor in top view, first finger electrode portions 135b extending from the first ring-shaped electrode portion 135a towards an outer edge termination region 191 of the semiconductor wafer in top view, and second finger electrode portions 135c that bifurcate from the first finger electrode portions 135b and extend towards the outer edge termination region 191 of the semiconductor wafer.

Similarly, a second amplifying gate electrode 145 (which is an example of the second gate electrode in the claims) is arranged on the second main side 104 as can be seen in FIG. 1 or in FIG. 3. The second amplifying gate electrode 145 is electrically separated from the second main electrode 116 and is in direct contact with the p-doped fourth semiconductor layer 112 to form an ohmic contact with the p-doped fourth semiconductor layer 112 at a position lateral to the second main electrode 116. As can be seen best from FIG. 3, the second amplifying gate electrode 145 comprises a second ring-shaped electrode portion 145a, which is concentric with a center of the semiconductor in top view, third finger electrode portions 145b extending from the first ring-shaped electrode portion 145a towards the outer edge termination region 191 of the semiconductor wafer in top view, and fourth finger electrode portions 145c that bifurcate from the third finger electrode portions 145b towards the edge termination region 191 of the semiconductor wafer indicated in FIG. 2 or 3.

In an orthogonal projection onto a plane parallel to the first main side 102 an area occupied by the first semiconductor layer 106 and the first emitter shorts 128 will be referred to as a first area. Similarly, an area occupied by the fifth semiconductor layer 114 and the second emitter shorts 138 in the orthogonal projection onto the plane parallel to the first main side 102 will be referred to as a second area. The area in which the first area overlaps with the second area in the orthogonal projection onto the plane parallel to the first main side 102 is referred to as an overlapping area. In the orthogonal projection onto the plane parallel to the first main side 102 the first emitter shorts 128 and the second emitter shorts 138 are located within the overlapping area. In the bidirectional thyristor device 100 according to the embodiment the first area is identical to the second area, i.e. there is a perfect overlap between the first and second area.

A first thyristor comprising four semiconductor layers having alternating conductivity types, i.e. an n-p-n-p layer stack structure is formed in the bidirectional thyristor device 100 by the $n^+$-doped first semiconductor layer 106, the p-doped second semiconductor layer 108, the $n^-$-doped third semiconductor layer 110, the p-doped fourth semiconductor layer 112 and the second emitter shorts 138. The $n^+$-doped first semiconductor layer 106 is a cathode emitter layer of the first thyristor, the p-doped second semiconductor layer 108 is a p-doped base layer of the first thyristor, the $n^-$-doped third semiconductor layer 110 is a $n^-$-doped base layer of the first thyristor, and the p-doped fourth semiconductor layer 112 and the second emitter shorts 138 form together an anode layer of the first thyristor. The first main electrode 115 is a cathode electrode of the first thyristor, and the second main electrode 116 is an anode electrode of the first thyristor.

A second thyristor comprising four semiconductor layers having alternating conductivity types, i.e. an n-p-n-p layer stack structure is formed in the bidirectional thyristor device 100 by the $n^+$-doped fifth semiconductor layer 114, the p-doped fourth semiconductor layer 112, the $n^-$-doped third semiconductor layer 110, the p-doped second semiconductor layer 108 and the first emitter shorts 128. The $n^+$-doped fifth semiconductor layer 114 is a cathode emitter layer of the second thyristor, p-doped fourth semiconductor layer 112 is a p-doped base layer of the second thyristor, the $n^-$-doped third semiconductor layer 110 is an $n^-$-doped base layer of the second thyristor, and the p-doped second semiconductor layer 108 and the first emitter shorts 128 form together an anode layer of the second thyristor. The second main electrode 116 is a cathode electrode of the second thyristor, and the first main electrode 115 is an anode electrode of the second thyristor.

Accordingly, the first and the second thyristor are integrated in the bidirectional thyristor device 100 in an antiparallel configuration between the first and second main electrode 115 and 116.

To facilitate triggering of the first thyristor in the bidirectional thyristor device 100, a first auxiliary thyristor is provided. The first auxiliary thyristor may also be referred to as a first pilot thyristor and is arranged laterally next to the first thyristor in the semiconductor wafer. In the orthogonal projection onto the plane parallel to the first main side 102 the first auxiliary thyristor is positioned in the center region of the wafer. The first auxiliary thyristor comprises four semiconductor layers having alternating conductivity types, i.e. an n-p-n-p layer stack structure like the first thyristor. In an order from the first main side 102 of the semiconductor wafer to the second main side 104 of the semiconductor wafer, the first auxiliary thyristor is formed by an $n^+$-doped first auxiliary cathode emitter layer 152, the p-doped second semiconductor layer 108, the $n^-$-doped third semiconductor layer 110, and the p-doped fourth semiconductor layer 112 together with the second emitter shorts 138. In the orthogonal projection onto the plane parallel to the first main side 102, the $n^+$-doped first auxiliary cathode emitter layer 152 is ring-shaped around a lateral center of the semiconductor wafer. The $n^+$-doped first auxiliary cathode emitter layer 152 is overlapped and electrically contacted by an inner portion of the ring-shaped electrode portion 135a formed on the first main side 102 of the semiconductor wafer. In the embodiment the first amplifying gate electrode 135 is an amplifying gate for the first thyristor. In the center of the semiconductor wafer a first main gate electrode 175 is formed on the first main side 102 to be in direct contact with the p-doped second semiconductor layer 108.

To facilitate triggering of the second thyristor in the bidirectional thyristor device 100, a second auxiliary thyristor is provided. The second auxiliary thyristor may also be referred to as a second pilot thyristor and is arranged laterally next to the second thyristor in the semiconductor wafer. In the orthogonal projection onto the plane parallel to the first main side 102 the second auxiliary thyristor is positioned in the center region of the semiconductor wafer. The first auxiliary thyristor comprises four semiconductor layers having alternating conductivity types, i.e. an n-p-n-p layer stack structure like the second thyristor. In an order from the second main side 104 of the semiconductor wafer to the first main side 102 of the semiconductor wafer, the second auxiliary thyristor is formed by an $n^+$-doped second auxiliary cathode emitter layer 162, the p-doped fourth semiconductor layer 112, the $n^-$-doped third semiconductor layer 110, and the p-doped second semiconductor layer 112 together with the first emitter shorts 128. In the orthogonal projection onto the plane parallel to the first main side 102, the $n^+$-doped second auxiliary cathode emitter layer 162 is ring-shaped around the lateral center of the semiconductor wafer. The $n^+$-doped second auxiliary cathode emitter layer 162 is overlapped and electrically contacted by an inner portion of the ring-shaped electrode portion 145a formed on the second main side 104 of the semiconductor wafer. In the embodiment, the second amplifying gate electrode 145 is an amplifying gate for the second thyristor. In the center of the semiconductor wafer a second main gate electrode 185 is formed on the second main side 104 to be in direct contact with the p-doped fourth semiconductor layer 112.

The first main gate electrode 175 may be connected to a gate unit (not shown in the Figures) via a first thin wire (not shown in the Figures), whereas the first main electrode 115 may be contacted by pressing a first molybdenum disk (not shown in the Figures) thereon. Likewise the second main gate electrode 185 may be connected to a gate unit (not shown in the Figures) via a second thin wire (not shown in the Figures), whereas the second main electrode 116 may be contacted by pressing a second molybdenum disk (not shown in the Figures) thereon.

In operation the plasma formation will spread during triggering of the first thyristor in the p-doped second semiconductor layer 108, in the $n^-$-doped third semiconductor layer 110 and in the p-doped fourth semiconductor layer 112 in a direction away from the first amplifying gate electrode 135, wherein the ignition process is speeded up by the distributed gate structure provided by the first amplifying gate electrode 135. Likewise, the plasma formation will spread during triggering of the second thyristor in the p-doped fourth semiconductor layer 112, in the $n^-$-doped third semiconductor layer 110 and the p-doped second semiconductor layer 108, in a direction away from the second amplifying gate electrode 145 wherein the ignition process is speeded up by the distributed gate structure provided by the second amplifying gate electrode 145.

When being viewed in the orthogonal projection onto the plane parallel to the first main side 102, the first emitter shorts 128 may occupy at least 2%, exemplarily at least 5%, exemplarily at least 8%, more exemplarily at least 10% of the overlapping area in which the first and the second area overlap. Likewise, when being viewed in the orthogonal projection onto the plane parallel to the first main side, the second emitter shorts 138 may occupy at least 2%, exemplarily at least 5%, exemplarily at least 8%, more exemplarily at least 10% of the overlapping area in which the first and the second area overlap.

Further, in the bidirectional thyristor device 100 of the embodiment the first emitter shorts 128 are distributed in the orthogonal projection onto the first main side 102 in a manner that a distance between two neighbouring discrete first emitter shorts 128 is decreasing with increasing distance from the first amplifying gate electrode 135. Such variation of the density of the first emitter shorts 128 allows the second thyristor to have a relatively low on-state voltage at a high anode current while the first thyristor can be triggered at a relatively low anode current (i.e. the first thyristor has a high di/dt capability). Therein, the average distance between two neighbouring first emitter shorts 128 at a certain distance d from the first amplifying gate electrode 135 means the arithmetic mean of all pairs of neighbouring first emitter shorts 128 in an area including all positions that have a distance in a range from d to d+Δd, wherein Δd is constant for the calculation of the average distance at all distances d, for example Δd=5 mm. The density of the first emitter shorts 128 may increase either continuously with increasing distance from the first amplifying gate electrode 135 or may increase stepwise, i.e. there is a first region close to the first gate region, in which the density of the first emitter shorts 128 is relatively low (i.e. the average distance between neighbouring first emitter shorts 128 is relatively high) and a second region farther away from the first amplifying gate electrode 135 than the first region (i.e. the second region is separated from the first amplifying gate electrode 135 by the first region), in which the density of the first emitter shorts 128 is higher compared to the density of the first emitter shorts 128 in the first region (i.e. the average distance between neighbouring first emitter shorts 128 is lower compared to the average distance in the first region).

Likewise, in the bidirectional thyristor device 100 of the embodiment the second emitter shorts 138 are distributed in the orthogonal projection onto the first main side 102 in a manner that a distance between two neighbouring discrete second emitter shorts 138 is decreasing with increasing (lateral) distance from the second amplifying gate electrode 145. Such variation of the density of the second emitter shorts 138 allows the first thyristor to have a relatively low on-state voltage at a high anode current while the second thyristor can be triggered at a relatively low anode current (i.e. the second thyristor has a high didt capability). Therein, the average distance between two neighbouring second emitter shorts 138 at a certain distance d from the second amplifying gate electrode 145 means the arithmetic mean of a distance between all pairs of neighbouring second emitter shorts 138 in an area including all positions that have a distance in a range from d to d+Δd, wherein Δd is constant for the calculation of the average distance at all distances d, for example Δd=5 mm. The density of the second emitter shorts 138 may increase either continuously with increasing distance from the second amplifying gate electrode 145 or may increase stepwise, i.e. there is a first region dose to the second amplifying gate region 145, in which the density of the second emitter shorts 138 is relatively low (i.e. the average distance between neighbouring second emitter shorts 138 is relatively high) and a second region farther away from the second amplifying gate electrode 145 than the first region (i.e. the second region is separated from the second amplifying gate electrode 145 by the first region), in which the density of the second emitter shorts 138 is higher compared to the density of the second emitter shorts 138 in the first region (i.e. the average distance between neighbouring second emitter shorts 138 is lower compared to the average distance in the first region).

Figure 4:
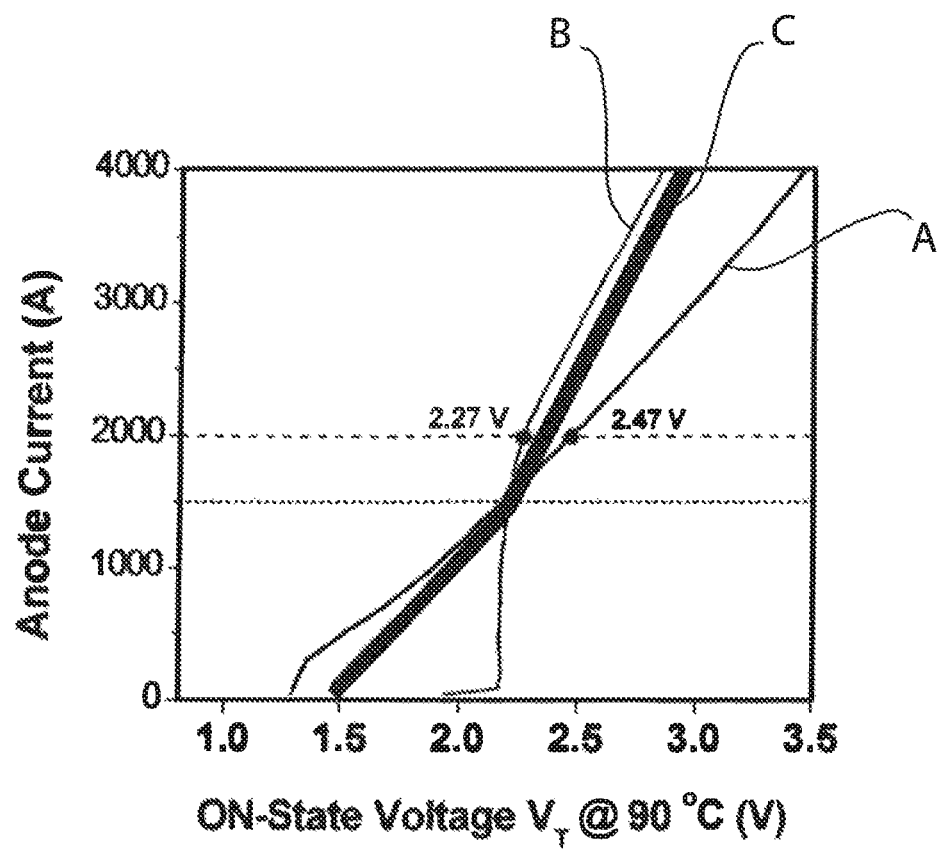
FIG. 4 shows an I-V curve of bidirectional thyristor devices having different patterns of first and second emitter shorts.

The effect of the variation of the density of the first and second emitter shorts 128 and 138 can be seen best from FIG. 4. There are shown the I-V curves for three different bidirectional thyristor devices. The three different bidirectional thyristor devices were identical with each other except for the density and pattern of the first and second emitter shorts 128 and 138. In all three different bidirectional thyristor devices the pattern of the first emitter shorts 128 were identical to the pattern of the second emitter shorts 138. The first curve A was measured for a bidirectional thyristor device having a constant low density of first and second emitter shorts 128 and 138, the second curve B was measured for a bidirectional thyristor device having a constant but relatively high density of first and second emitter shorts 128 and 138, and the third curve C was measured for a bidirectional thyristor device according to the embodiment, in which the density of the first and second emitter shorts 128 and 138 is varied to increase with increasing distance from the first and second amplifying gate electrodes 135 and 145, respectively. It can be seen that in curve A the bidirectional thyristor device is triggered at relatively low anode current but has a relatively high on-state voltage at high anode currents, whereas according to curve B the bidirectional thyristor device is triggered only at relatively high anode current but has a relatively low on-state voltage at high anode current. Finally, the curve C which was measured at the bidirectional thyristor with a variation of the density of first and second emitter shorts as explained above is triggered at a relatively low anode current and has a relatively low on-state voltage at high anode currents. The area of thyristors discussed above allows one to specify a typical rating current of about 2.5 kA. FIG. 4 shows that the application of the dense emitter short pattern provides a relatively low ON-state voltage even under overload conditions (short circuit operation) well above 2.5 kA.

Figure 5:
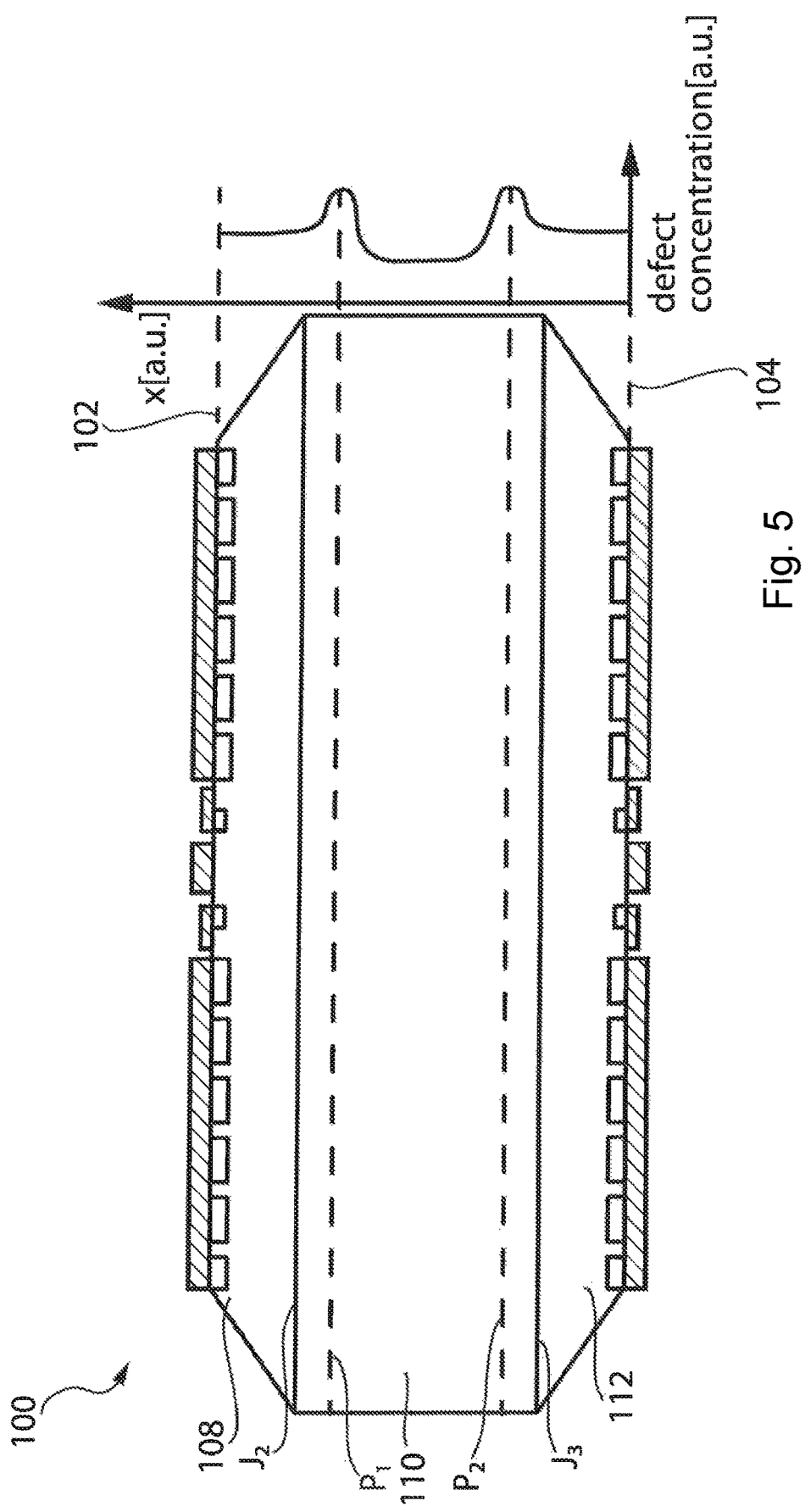
FIG. 5 shows a cross-sectional view of a bidirectional thyristor device of FIG. 1 together with a graph illustrating the spatial distribution of deep energetic levels in an energy band gap (point defects)

As illustrated in FIG. 5, in the bidirectional thyristor device 100 according to the embodiment a (spatial) density of deep levels (radiation defects) acting as recombination centers in the n⁻-doped third semiconductor layer 110 has along a line extending perpendicular to the first main side 102, a first local maximum which is closer to the second p-n junction $J_2$ than to the third p-n junction $J_3$, and has a second local maximum which is closer to the third p-n junction $J_3$ than to the second p-n junction $J_2$. In FIG. 5 the position of the first local maximum of the density of deep levels is indicated by a dotted line $P_1$ and the position of the second local maximum of the density of deep levels is indicated by a dotted line $P_2$ in FIG. 5. On the right side of FIG. 5 there is shown the density of deep levels (i.e. density of radiation defects which is referred to as a defect concentration in FIG. 5) as a function of the depth x from the second main side 104. The first local maximum may exemplarily be less than 50 μm from the second p-n junction $J_2$, and the second local maximum may be exemplarily less than 50 μm from the third p-n junction $J_3$. The local maximum of the density of deep levels acting as recombination centers in the third semiconductor layer close to the second and/or third p-n junction can improve the turn-off capability of the bidirectional thyristor device. With growing distance of $P_1$ ($P_2$) from the adjacent p-n junction $J_2$ ($J_3$) the turn-off capability improvement grows at the penalty of a higher ON-state voltage drop (losses). An optimal distance of $P_1$ ($P_2$) from the adjacent junction $J_2$ ($J_3$) exists for a given thyristor structure and application (commutation turn-off) conditions.

The first local maximum of the density of deep levels in the third semiconductor layer 110 can, for example, be generated by proton irradiation with an appropriate energy that depends on the material and thickness of the layers through which the protons shall go through to form the deep level centers in the desired position relative to the second and third p-n junction $J_2$ and $J_3$. The deep levels may also be generated by irradiation with other particles such as electron irradiation or helium irradiation.

Figure 6A:
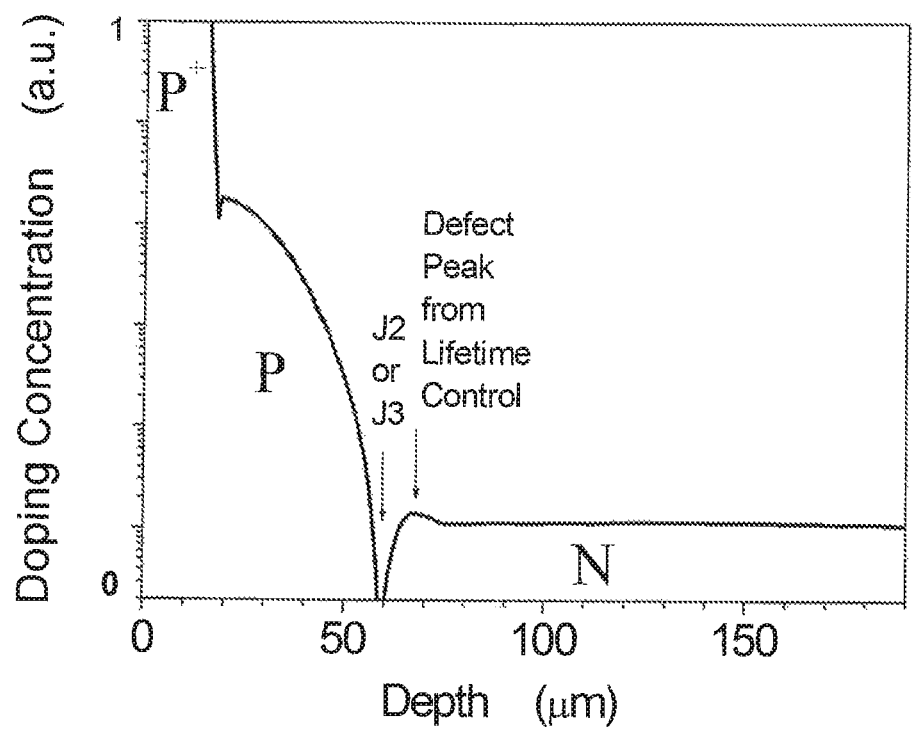
FIG. 6a shows a result of spreading resistance profiling for a specific example of the bidirectional thyristor device according to the embodiment.
Figure 6B:
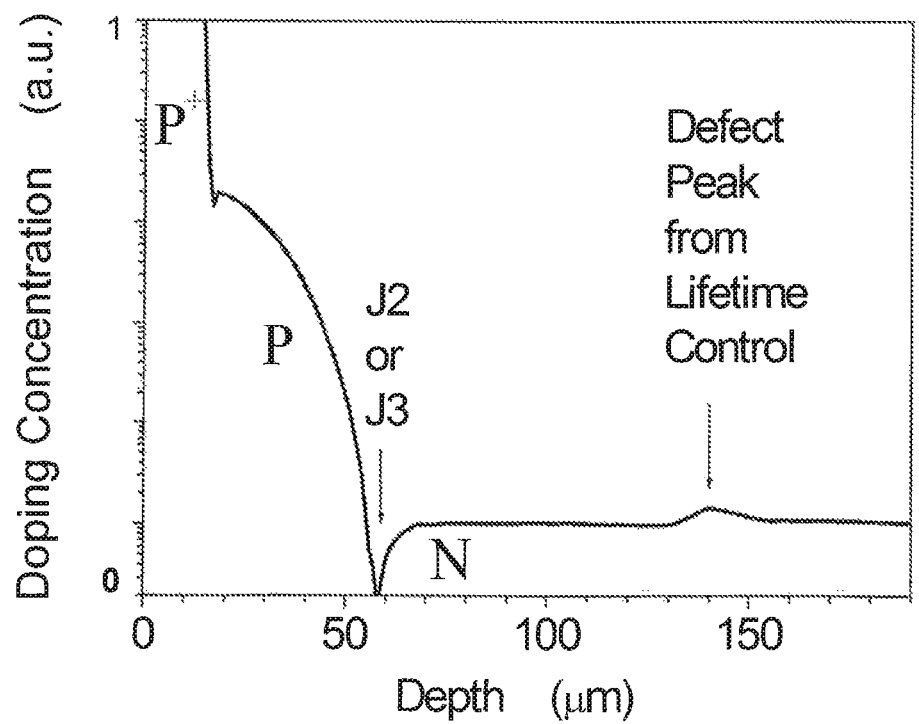
FIG. 6b shows a result of spreading resistance profiling for another specific example of the bidirectional thyristor device according to the embodiment.

In accordance with the first and second local maximum of the density of deep levels acting as recombination centers in the n⁻-doped third semiconductor layer 110, an excess carrier lifetime has a first and second local minimum at the same position as the first and second local maximum of the density of deep levels. The position of local minima of the excess carrier lifetime can, for example, be measured by spreading resistance profiling, which can show a local deviation from the background doping concentration in the n⁻-doped third semiconductor layer 110 as a result of doping compensation by the acceptor type deep energetic levels formed by the radiation defects. In FIG. 6a there is shown a measurement result of spreading resistance profiling for a specific example of the bidirectional thyristor device according to the embodiment, in which the density of deep levels had a local maximum at a distance of about 10 μm from the p-n junction $J_2/J_3$, and in FIG. 6b there is shown a measurement result of spreading resistance profiling for another specific example of the bidirectional thyristor device according to the embodiment, in which the density of deep levels had a local maximum at a distance of about 80 μm from the p-n junction $J_2/J_3$. The locally reduced excess carrier lifetime facilitates the turn-off capability of the bidirectional thyristor device for both polarities.

It will be apparent for persons skilled in the art that modifications of the above described embodiment are possible without departing from the scope of the invention as defined by the appended claims.

In the bidirectional thyristor device 100 according to the embodiment the first area is identical to the second area, i.e. there is a perfect overlap between the first and second area. However, the bidirectional thyristor device of the invention may not have a perfect overlap between the first and the second area. It is sufficient if there exists an overlapping area between the first and second area in the orthogonal projection on the plane parallel to the first main side. In an exemplary embodiment of the bidirectional thyristor device, when being viewed in the orthogonal projection onto the plane parallel to a first main side of the semiconductor wafer, an overlapping area, in which the first area overlaps with the second area, encompasses at least 50% of a total wafer area occupied by the semiconductor wafer.

In the above embodiment of the bidirectional thyristor device some or all of the first to fourth finger electrode portions 135b, 135c, 145b, 145c may be omitted. Likewise the first and second amplifying gate electrodes 135, 145 may include additional finger electrode portions.

Also while the embodiment was described with the first pilot thyristor for facilitating triggering of the first thyristor and with the second pilot thyristor for facilitating triggering of the second thyristor, the bidirectional thyristor device of the invention does not necessarily include any pilot thyristor for triggering the first and second thyristor. That means that the whole first amplifying gate electrode 135 and the n⁺-doped first auxiliary cathode emitter layer 152 can be omitted. In this case the first main gate electrode would correspond to the first gate electrode in the claims. Likewise, the whole second amplifying gate electrode 145 and the n⁺-doped second auxiliary cathode emitter layer 162 could be omitted. In this case the second main gate electrode would correspond to the second gate electrode in the claims.

In the Figures of the above described embodiment the semiconductor wafer is shown in FIGS. 2 and 3 as a circular wafer. However, the invention can also be applied to other geometries of the semiconductor wafer. For example the semiconductor wafer may also have a rectangular shape or a polygonal shape.

The first emitter shorts 128 were described to be p-type semiconductor regions. However, they may also be formed of another conductive material which forms an ohmic contact to the p-doped second semiconductor layer 108. Likewise, the second emitter shorts 138 were described to be p-type semiconductor regions. However, they may also be formed of another conductive material which forms an ohmic contact to the p-doped fourth semiconductor layer 112.

The above embodiment was described without any emitter shorts in the n⁺-doped first cathode emitter layer 152 or in the n⁺-doped second cathode emitter layer 162. However, there may be provided first auxiliary emitter shorts penetrating through the n⁺-doped first cathode emitter layer 152 for connecting the p-type first semiconductor layer 108 with the first ring-shaped electrode portion 135a. Likewise there may be formed second auxiliary emitter shorts penetrating through the n⁺-doped second cathode emitter layer 162 for connecting the p-type fourth semiconductor layer 112 with the second ring-shaped electrode portion 145a.

In the above embodiment of the bidirectional thyristor device the first and fifth semiconductor layers 106 and 116 extend up to the edge termination region 191. However, a p-anode ring of the second thyristor (i.e. a cathode short ring of the first thyristor) contacted by the first main electrode 115 may be formed at the first main side 102 to laterally surround the outer edge of the first semiconductor layer 106. Likewise, a p-anode ring of the first thyristor (i.e. a cathode short ring of the second thyristor) contacted by the second main electrode 116 may be formed at the second main side 104 to laterally surround the outer edge of the fifth semiconductor layer 114. While the existence of this p-anode ring at the cathode side improves blocking stability, it provides at the same time a larger anode area at the opposite side.

In addition or alternatively to the before explained variation of the average distance between neighbouring first emitter shorts 128 the average lateral size of the first emitter shorts 128 may increase with increasing distance from the first amplifying gate electrode 135. Likewise, in addition or alternatively to the before explained variation of the average distance between neighbouring second emitter shorts 138 the average lateral size of the second emitter shorts 138 may increase with increasing distance from the second amplifying gate electrode 145.

In the above described embodiment the second and third p-n junctions $J_2$ and $J_3$ were respectively plane and parallel to the first main side. However, the distance between the second and third p-n junctions $J_2$ and $J_3$ may vary, for example in such way that the distance between the second and third p-n junctions $J_2$ and $J_3$ is smaller in the edge termination region than in an active region of the device.

In the above described embodiment the junction termination was formed by a negative bevel. However, the junction termination may be formed by positive bevel, combination of positive-negative bevel, guard rings, variation of lateral doping (VLD) structure, junction termination extension (JTE) or another semiconductor structure appropriate for this purpose.

It should be noted that the term "comprising" does not exclude other elements or steps and that the indefinite article "a" or "an" does not exclude the plural. Also elements described in association with different embodiments may be combined.

LIST OF REFERENCE SIGNS 100 bidirectional thyristor device
102 first main side
104 second main side
106 $n^+$-doped first semiconductor layer
108 p-doped second semiconductor layer
110 $n^-$-doped third semiconductor layer
112 p-doped fourth semiconductor layer
114 $n^+$-doped fifth semiconductor layer
115 first main electrode
116 second main electrode
128 first emitter shorts
135 first amplifying gate electrode
135a first ring-shaped electrode portion
135b first finger electrode portion
135c second finger electrode portion
138 second emitter shorts
145 second amplifying gate electrode
145a second ring-shaped electrode portion
145b third finger electrode portion
145c fourth finger electrode portion
152 $n^+$-doped first auxiliary cathode emitter layer
162 $n^+$-doped second auxiliary cathode emitter layer
175 first main gate electrode
185 second main gate electrode
$J_1$ first p-n junction
$J_2$ second p-n junction
$J_3$ third p-n junction
$J_4$ fourth p-n junction
$P_1$ first local maximum of the density of deep levels
$P_2$ second local maximum of the density of deep levels

The invention claimed is:

1. A bidirectional thyristor device comprising:
a semiconductor wafer having a first main side and a second main side opposite to the first main side, wherein the semiconductor wafer includes in an order from the first main side to the second main side the following layers:
a first semiconductor layer of a first conductivity type;
a second semiconductor layer of a second conductivity type different from the first conductivity type, wherein the first semiconductor layer and the second semiconductor layer form a first p-n junction;
a third semiconductor layer of the first conductivity type, the second semiconductor layer and the third semiconductor layer forming a second p-n junction;
a fourth semiconductor layer of the second conductivity type, wherein the third semiconductor layer and the fourth semiconductor layer form a third p-n junction; and
a fifth semiconductor layer of the first conductivity type, wherein the fourth semiconductor layer and the fifth semiconductor layer form a fourth p-n junction;
a first main electrode arranged on the first main side and in direct contact with the first semiconductor layer;
a first gate electrode is arranged on the first main side spaced from the first main electrode, the first gate electrode in direct contact with the second semiconductor layer;
a second main electrode arranged on the second main side and in direct contact with the fifth semiconductor layer; and
a second gate electrode arranged on the second main side spaced from the second main electrode, the second gate electrode in direct contact with the fourth semiconductor layer;
a plurality of first emitter shorts, each first emitter short penetrating through the first semiconductor layer to electrically connect the second semiconductor layer with the first main electrode; and
a plurality of second emitter shorts, each second emitter short penetrating through the fifth semiconductor layer to electrically connect the fourth semiconductor layer with the second main electrode;
wherein, in an orthogonal projection onto a plane parallel to the first main side, a first area occupied by the first semiconductor layer and the first emitter shorts overlaps in an overlapping area with a second area occupied by the fifth semiconductor layer and the second emitter shorts; and
wherein, in the orthogonal projection onto the plane parallel to the first main side, the overlapping area, in which the first area overlaps with the second area, encompasses at least 50% of a total wafer area occupied by the semiconductor wafer.

2. The bidirectional thyristor device according to claim 1, wherein, in the orthogonal projection onto the plane parallel to the first main side, the first emitter shorts occupy at least 2% of the overlapping area.

3. The bidirectional thyristor device according to claim 1, wherein, in the orthogonal projection onto the plane parallel to the first main side, the first emitter shorts occupy at least 5% of the overlapping area.

4. The bidirectional thyristor device according to claim 1, wherein, in the orthogonal projection onto the plane parallel to the first main side, the first emitter shorts occupy at least 10% of the overlapping area.

5. The bidirectional thyristor device according to claim 1, wherein, in in the orthogonal projection onto the plane parallel to the first main side, the first emitter shorts are discrete.

6. The bidirectional thyristor device according to claim 5, wherein a distance between two neighboring first emitter shorts is varied in such way that an average distance between two neighboring first emitter shorts decreases with increasing distance from the first gate electrode.

7. The bidirectional thyristor device according to claim 5, wherein, in the orthogonal projection onto the plane parallel to the first main side, the second emitter shorts are discrete.

8. The bidirectional thyristor device according to claim 1, wherein, in the orthogonal projection onto the plane parallel to the first main side, the first emitter shorts and the second emitter shorts have a lateral size in a range from 30 μm to 500 μm.

9. The bidirectional thyristor device according to claim 1, wherein, in the orthogonal projection onto the plane parallel to the first main side, the first emitter shorts and the second emitter shorts have a lateral size in a range from 50 μm to 200 μm.

10. The bidirectional thyristor device according to claim 1, wherein, in the orthogonal projection onto the plane parallel to the first main side, the first gate electrode has a rotational symmetry.

11. The bidirectional thyristor device according to claim 10, wherein, in the orthogonal projection onto the plane parallel to the first main side, the first gate electrode and the second gate electrode have a rotational symmetry.

12. The bidirectional thyristor device according to claim 1, wherein, in the orthogonal projection onto the plane parallel to the first main side, the first gate electrode and the second gate electrode have the same shape.

13. The bidirectional thyristor device according to claim 1, wherein a density of deep levels acting as recombination centers in the third semiconductor layer has a first local maximum that is closer to the second p-n junction than to the third p-n junction.

14. The bidirectional thyristor device according to claim 13, wherein the density of deep levels acting as recombination centers in the third semiconductor layer has a second local maximum that is closer to the third p-n junction than to the second p-n junction.

15. The bidirectional thyristor device according to claim 13, wherein the first local maximum is less than 50 µm from the second p-n junction.

16. The bidirectional thyristor device according to claim 1, wherein an excess carrier lifetime has a first local minimum in the third semiconductor layer that is closer to the second p-n junction than to the third p-n junction.

17. The bidirectional thyristor device according to claim 16, wherein the excess carrier lifetime has a second local minimum which is closer to the third p-n junction than to the second p-n junction.

18. The bidirectional thyristor device according to claim 16, wherein the first local minimum is less than 50 µm from the second p-n junction.

19. A bidirectional thyristor device comprising:
a semiconductor wafer having a first main side and a second main side opposite to the first main side, wherein the semiconductor wafer includes in an order from the first main side to the second main side the following layers:
  a first semiconductor layer of a first conductivity type;
  a second semiconductor layer of a second conductivity type different from the first conductivity type, wherein the first semiconductor layer and the second semiconductor layer form a first p-n junction;
  a third semiconductor layer of the first conductivity type, the second semiconductor layer and the third semiconductor layer forming a second p-n junction;
  a fourth semiconductor layer of the second conductivity type, wherein the third semiconductor layer and the fourth semiconductor layer form a third p-n junction; and
  a fifth semiconductor layer of the first conductivity type, wherein the fourth semiconductor layer and the fifth semiconductor layer form a fourth p-n junction;
a first main electrode arranged on the first main side and in direct contact with the first semiconductor layer;
a first gate electrode is arranged on the first main side spaced from the first main electrode, the first gate electrode in direct contact with the second semiconductor layer;
a second main electrode arranged on the second main side and in direct contact with the fifth semiconductor layer; and
a second gate electrode arranged on the second main side spaced from the second main electrode, the second gate electrode in direct contact with the fourth semiconductor layer;
a plurality of first discrete emitter shorts, each first emitter short penetrating through the first semiconductor layer to electrically connect the second semiconductor layer with the first main electrode, wherein a distance between two neighboring first emitter shorts is varied in such way that an average distance between two neighboring first emitter shorts decreases with increasing distance from the first gate electrode; and
a plurality of second discrete emitter shorts, each second emitter short penetrating through the fifth semiconductor layer to electrically connect the fourth semiconductor layer with the second main electrode, wherein a distance between two neighboring second emitter shorts is varied in such way that an average distance between two neighboring second emitter shorts decreases with increasing distance from the second gate electrode;
wherein, in an orthogonal projection onto a plane parallel to the first main side, a first area occupied by the first semiconductor layer and the first emitter shorts overlaps in an overlapping area with a second area occupied by the fifth semiconductor layer and the second emitter shorts; and
wherein, in the orthogonal projection onto the plane parallel to the first main side, the overlapping area, in which the first area overlaps with the second area, encompasses at least 50% of a total wafer area occupied by the semiconductor wafer.

20. A bidirectional thyristor device comprising:
a semiconductor wafer having a first main side and a second main side opposite to the first main side, wherein the semiconductor wafer includes in an order from the first main side to the second main side the following layers:
  a first semiconductor layer of a first conductivity type;
  a second semiconductor layer of a second conductivity type different from the first conductivity type, wherein the first semiconductor layer and the second semiconductor layer form a first p-n junction;
  a third semiconductor layer of the first conductivity type, the second semiconductor layer and the third semiconductor layer forming a second p-n junction;
  a fourth semiconductor layer of the second conductivity type, wherein the third semiconductor layer and the fourth semiconductor layer form a third p-n junction; and
  a fifth semiconductor layer of the first conductivity type, wherein the fourth semiconductor layer and the fifth semiconductor layer form a fourth p-n junction;
a first main electrode arranged on the first main side and in direct contact with the first semiconductor layer;
a first gate electrode is arranged on the first main side spaced from the first main electrode, the first gate electrode in direct contact with the second semiconductor layer;
a second main electrode arranged on the second main side and in direct contact with the fifth semiconductor layer; and
a second gate electrode arranged on the second main side spaced from the second main electrode, the second gate electrode in direct contact with the fourth semiconductor layer;
a plurality of first emitter shorts, each first emitter short penetrating through the first semiconductor layer to electrically connect the second semiconductor layer with the first main electrode; and
a plurality of second emitter shorts, each second emitter short penetrating through the fifth semiconductor layer to electrically connect the fourth semiconductor layer with the second main electrode;

wherein, in an orthogonal projection onto a plane parallel to the first main side, a first area occupied by the first semiconductor layer and the first emitter shorts overlaps in an overlapping area with a second area occupied by the fifth semiconductor layer and the second emitter shorts;

wherein, in the orthogonal projection onto the plane parallel to the first main side, the overlapping area, in which the first area overlaps with the second area, encompasses at least 50% of a total wafer area occupied by the semiconductor wafer;

wherein a density of deep levels acting as recombination centers in the third semiconductor layer has a first local maximum that is closer to the second p-n junction than to the third p-n junction, the first local maximum is less than 50 µm from the second p-n junction; and wherein the density of deep levels acting as recombination centers in the third semiconductor layer has a second local maximum that is closer to the third p-n junction than to the second p-n junction, the second local maximum is less than 50 µm from the third p-n junction.

\* \* \* \* \*